US008908806B2

(12) United States Patent
Orlik et al.

(10) Patent No.: US 8,908,806 B2
(45) Date of Patent: Dec. 9, 2014

(54) METHOD AND SYSTEM FOR COMMUNICATING DATA WIRELESSLY USING PROBABILISTIC DATA ASSOCIATION

(71) Applicant: Mitsubishi Electric Research Laboratories, Inc., Cambridge, MA (US)

(72) Inventors: Philip Orlik, Cambridge, MA (US); Atulya Yellepeddi, Cambridge, MA (US); Kyeong-Jin Kim, Lexington, MA (US); Chunjie Duan, Brookline, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 109 days.

(21) Appl. No.: 13/775,847

(22) Filed: Feb. 25, 2013

(65) Prior Publication Data

US 2014/0241471 A1    Aug. 28, 2014

(51) Int. Cl.
*H04L 27/22* (2006.01)
*H04L 27/06* (2006.01)
*H04L 1/02* (2006.01)
*H04L 1/00* (2006.01)

(52) U.S. Cl.
CPC .................................. *H04L 1/0054* (2013.01)
USPC ............................. 375/316; 375/341; 375/347

(58) Field of Classification Search
USPC ......... 375/259, 261, 262, 267, 279, 280, 316, 375/340, 341, 347; 455/132
See application file for complete search history.

(56) References Cited

U.S. PATENT DOCUMENTS

| 8,290,074 B2 | 10/2012 | Annavajjala |
| 2005/0089112 A1 | 4/2005 | Piechocki |
| 2009/0054093 A1* | 2/2009 | Kim et al. ...................... 455/500 |

OTHER PUBLICATIONS

Annavajjala, R. and Orlik, P.V., "Achieving near-exponential diversity on uncoded low-dimensional MIMO, multi-user and multi-carrier systems without transmitter CSI," in IEEE Information Theory and Applications Workshop (ITA), 2011.
M. K. Varanasi, "Decision Feedback Multiuser Detection: A systematic Approach," IEEE Trans. on Inform. Theory., vol. 45, No. 1, Jan. 1999, pp. 219-240.

* cited by examiner

*Primary Examiner* — Tesfaldet Bocure
(74) *Attorney, Agent, or Firm* — Dirk Brinkman; Gene Vinokur

(57) ABSTRACT

A signal received via a fading channel is decoded in radio frequency receiver by first demodulating the signal to a baseband signal, and serial to parallel converting the baseband signal to a precoded signal. Then, a channel matrix is estimated from the precoded signal, and symbols are detected in the precoded signal using the channel matrix. The decoding uses probabilistic data association. The detecting initializes a probability distribution for each symbol, and selects an ordering in which to update the probability distributions. The probability distribution for each symbol are updated according to the ordering, until a termination condition is reached, and then demapped and parallel to serial converted to estimate a sequence of bits used to generate the signal.

14 Claims, 7 Drawing Sheets

METHOD AND SYSTEM FOR COMMUNICATING DATA WIRELESSLY USING PROBABILISTIC DATA ASSOCIATION

FIELD OF THE INVENTION

This invention relates generally to the field of wireless communication, and specifically to methods for transmitting and decoding symbols over channels subject to fading.

BACKGROUND OF THE INVENTION

M2M Communication

Wireless Machine-to-Machine (M2M) communication is important in a variety of applications, such as factory automation, wireless telemetry and advertising. M2M applications typically communicate very short blocks of data, with a very low probability of error and low latency.

However, the transmitted signal is subject to Rayleigh fading as the signal passes through the channel. While Multiple-Input Multiple-Output (MIMO) systems, which have space-diversity, perform well over Rayleigh fading channels, large MIMO systems are complex and difficult to implement, particularly on resource constrained devices that are typically used in M2M networks.

Thus, systems that are of interest use Single-Input Single Output (SISO) transceivers, or virtual MIMO systems with a small number of transmitters and/or receivers, which makes it difficult to take advantage of signal gains in MIMO systems.

To improve the performance for SISO and small MIMO systems, Annavajjala et al., in "Achieving near-exponential diversity on uncoded low-dimensional MIMO, multi-user and multi-carrier systems without transmitter CSI," IEEE Information Theory and Applications Workshop (ITA), 2011, describe that blocks of symbols can be "precoded" with a near-unitary matrix with elements selected at random in a Pseudo-Random Phase Precoding (PRPP) procedure. The symbols can be decoded using Maximum Likelihood (ML) decoding. That procedure achieves exponential diversity, which means that errors are reduced exponentially with the Signal-to-Noise Ratio (SNR), similar to the decoding symbols received via an Additive White Gaussian Noise (AWGN) channel.

The computational cost involved in ML decoding is very large, and thus, a sub-optimal Iterative Likelihood Search (ILS) procedure can be used. That procedure also converges to the ML solution for infinite block sizes, and thus achieves near-exponential diversity for large blocks. In practice, that procedure works for block sizes of about 400 symbols. However, it is often necessary, particularly in M2M applications, to transmit much smaller blocks.

SUMMARY OF THE INVENTION

The embodiments of the present invention provide methods and systems for precoding and decoding symbols for transmission over SISO or small virtual MIMO networks to achieve near-exponential diversity for small block sizes, e.g., 32 symbols or less, than is possible with conventional methods, with little or no penalty on the data rate.

In one embodiment, various precoding schemes are used at the transmitter, in conjunction with a probabilistic data association (PDA) filter at the receiver, which is used to decode the received signal.

The conventional PDA filter has been used as a statistical approach in the problem of plot association in a radar tracker. The PDA filter has also be used for multiuser (MU) detection in code division multiple access (CDMA) systems, and MIMO systems with a small number of antennas.

The PDA method according to the embodiments can be used in a precoder of a SISO system, and virtual MIMO systems.

The order in which the PDA filter decodes the symbols and a starting estimate for the PDA method are determined at the receiver based on information available to the precoder, and an estimate of the channel. The PDA method, along with an ordering mechanism described is termed an Ordered-PDA method.

A modification to the receiver involves iterating the Ordered-PDA method K times, each time with a different starting estimate. The starting estimate depends on the order of the decoding process, as well as previously decoded symbols. This is called the K-PDA method.

When a Walsh-Hadamard matrix is used at the precoder, a coding scheme adds four bits of redundancy, and is used in conjugation with a Walsh-Hadamard precoder.

The embodiments and variants can achieve near exponential diversity for block sizes as small as about 32 symbols, and can approach the performance of the ML decoder.

DETAILED DESCRIPTION OF THE PREFERRED EMBODIMENTS

Figure 1:
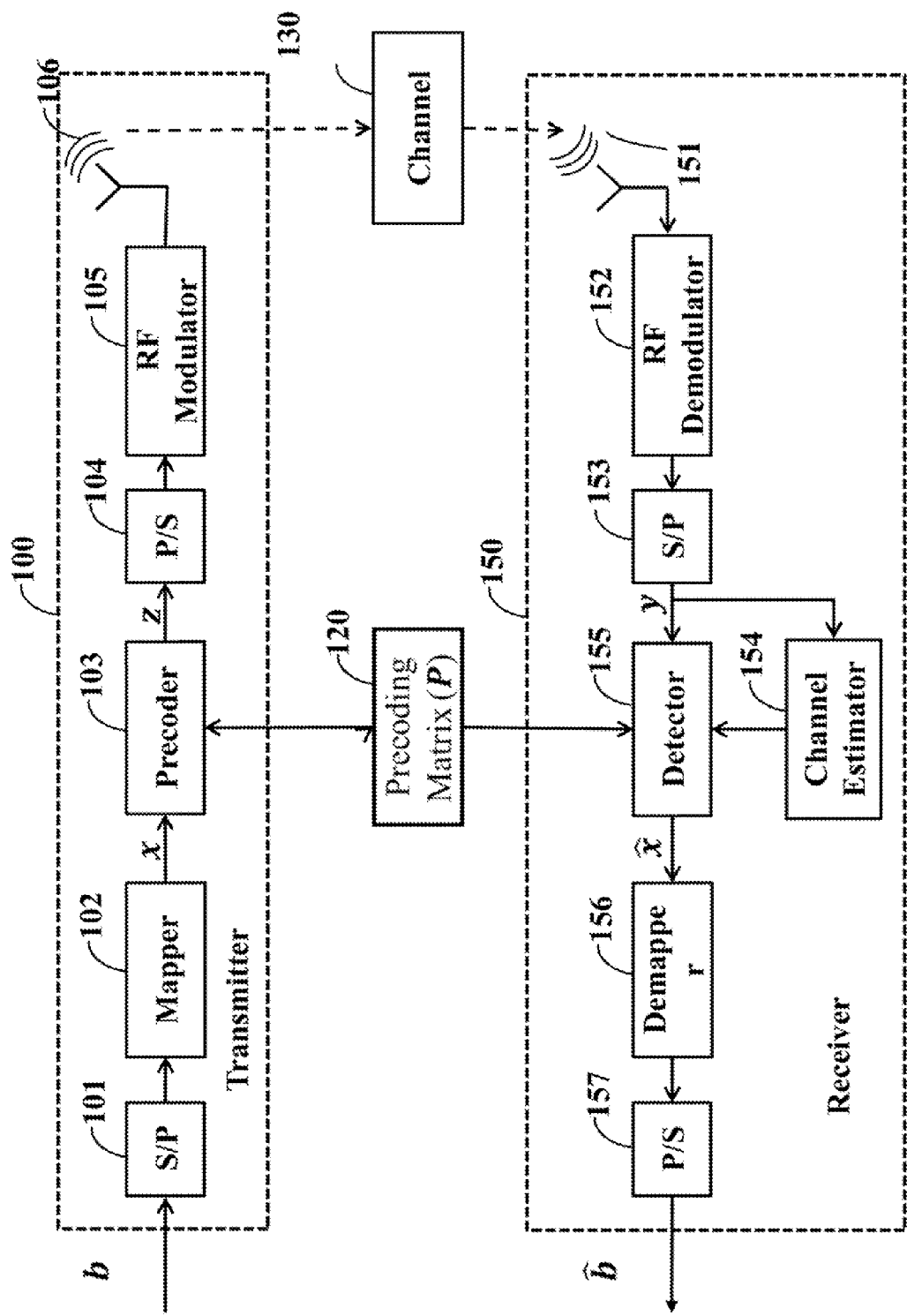
FIG. 1 is a block diagram of a communication system according to the embodiments of the invention.

FIG. 1 shows wireless communication system including a transmitter 100 and a receiver 150 according to the embodiments of the invention. The transmitter includes a set of one or more transmit antennas 106, and the receiver has a set of one or more receive antennas 151.

Transmitter

Input to the transmitter is a sequence of bits b. The bits are converted to a block of bits by a serial-to-parallel converter (S/P) 101. The block of bits is mapped 102 to a block of N symbols x.

The symbols are precoded 103 according to a precoding N×N matrix P 120 as Px to produce a block of precoded symbols z. Each precoded symbol is in a form of a complex number. The precoded symbols are parallel-to-serial (P/S) converted 104, and then radio frequency (RF) modulated 105 to producer an RF signal. The RF signals are transmitted over a, e.g., AWGN, channel 130 by the set of transmit antennas.

Receiver

At the receiver, the RF signal is received by the set of receive antennas, demodulated 152 to a baseband, and parallelized 153 to form into a precoded signal or vector y, as y=Hz+w, where H is a diagonal matrix of random channel coefficients, H=diag($h_1, \ldots, h_N$), and w is noise of size N×1. Because z and x are related by z=Px, this can be written as y=HPx+w. For convenience, we define G=HP, so that y=Gx+w.

A channel estimator 154 provides a reliable channel estimate H to the decoder 155. The received precoded signal vector y and channel estimate H are used in the detector 155 to form produce estimated symbols $\hat{x}$, which are converted do estimated bits $\hat{b}$ by a demapper 156.

The focus of the invention is on the detector 155. However, other components of the system can be modified, as described herein.

The precoding matrix is one of the PRPP matrices as described in U.S. Pat. No. 8,290,074, e.g., a discrete Fourier transform (DFT) matrix of dimension N×N normalized by $\sqrt{N}$, or the Walsh-Hadamard normalized by $\sqrt{N}$. Other matrices can also be used, and the detector architectures that are described can be applicable to such precoders.

It is assumed that the precoder increases the required transmitted power per block over that which would be required to transmit x over the channel, i.e., $z^\dagger z \leq x^\dagger x$, where the superscript † denotes the conjugate transpose (Hermitian) of a matrix or a sequence.

If the transmitted power is required to remain the same, then equality is required, which means that the precoding matrix P must be unitary. This is true for the normalized DFT and normalized Walsh-Hadamard matrices, but only approximately true for the PRPP matrix.

Symbols x are, e.g., BPSK, i.e., the mapper 102 maps each symbol to 1 or −1, depending on the input bit b. The described detectors make this assumption, but other modulation schemes can be used. The example system is a SISO system. With appropriate modifications, a system with multiple transmit and receive antennas can be used instead. However, the channel matrix in that case is not required to be diagonal, and the methods are adapted accordingly. It is also assumed that the channel estimator 154 provides highly reliable channel estimates to the detector 155.

In U.S. Pat. No. 8,290,074, a Likelihood Ascent Search is used in the detector. Other methods are also possible, e.g., probabilistic data association (PDA). The prior art does not use precoding to achieve diversity at the transmitted network, but use spatial diversity for large MIMO system.

Conventional Probabilistic Data Association (PDA) Method

An objective of the conventional PDA method is to approximate a maximum a posteriori probability (MAP) solution, i.e., to estimate $\hat{x}$ that maximizes the value of $p(\hat{x}|y)$ for the received signal y. The conventional MAP estimation for this case has a complexity that grows exponentially with N, which is impractical for M2M applications. PDA attempts to solve this problem by starting with equal probabilities that each transmitted symbol takes on one of all the possible values, and attempts to converge at the final probabilities by iterating between the symbols. Thus, PDA converges at a probability distribution on each of the transmitted symbols, whereby selecting the value that maximizes the probability of each individual transmitted symbol provides an approximation to the sequence $\hat{x}$. Ordering on symbol probabilities is not considered.

Figure 2:
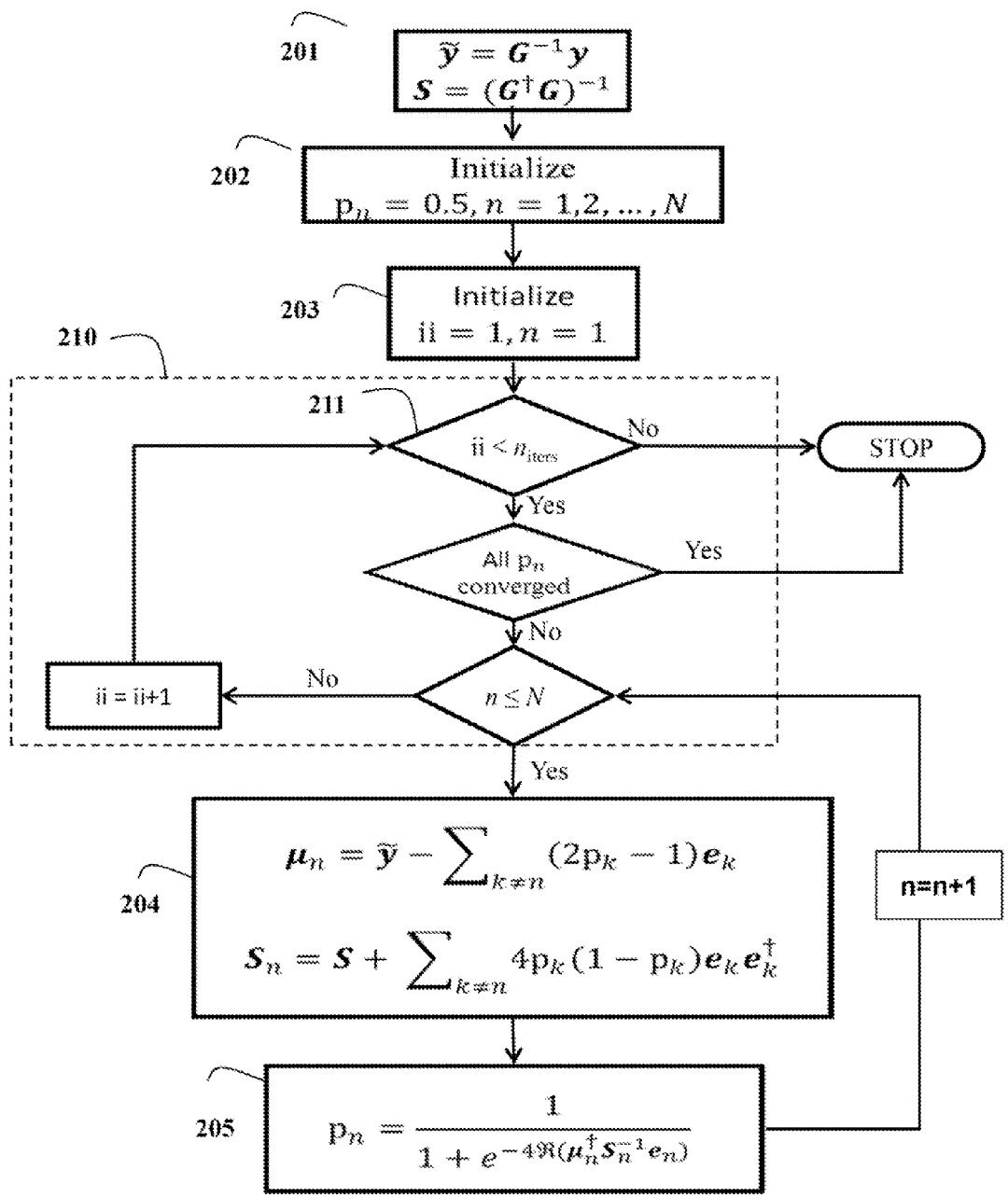
FIG. 2 is a flowchart of the PDA method in a precoded BPSK systems according to the embodiments of the invention.

FIG. 2 shows the prior art BPSK modulation method. In the context of BPSK modulation, each $x_n$ is 1 or −1, therefore it is sufficient to parameterize the distribution by the probability $p_n = \Pr(x_n=1)$. The PDA method updates the probability distribution of $x_n$ while treating all the other $x_k$ as noise. Specifically, the entire term $$v_n = \Sigma_{k \neq n} x_k e_k + \tilde{w}$$

is approximated as Gaussian noise for the estimation of the probability of $x_n$.

Beginning at 201, the model y=Gx+w can be written as $$G^{-1}y = x + G^{-1}w,$$

$$\tilde{y} = x_n e_n + \Sigma_{k \neq n} x_k e_k + \tilde{w},$$

where and $e_n$ is the $n^{th}$ column of the identity matrix. Note that as w is assumed to be white noise, whose covariance matrix is the identity matrix S. The channel estimator provides the channel matrix H, and the precoding matrix P is known, so that the matrix G is also known.

If each $x_n$ belongs to a constellation of size |X|, then the distribution of each $x_n$ requires |X|−1 parameters. In the PDA method, each $p_n$ is initialized 202 to 0.5, which indicates an equal probability for 1 or −1. Indices ii and n are initialized 203 for the iterations 210 to check for convergence 211 on all probabilities $p_n$.

The method determines $p_n$ in the BPSK case by finding the probability that $x_n=1$ conditioned on $\tilde{y}$ and the rest of the probabilities, $p_k$, k≠n, and treating that as an estimate of $p_n$. The method performs this for each n, and then iterates 210 until all the probabilities converge or a fixed number of iterations. Step 204 and 205 indicate the exact computations to be performed for each n.

This method has been disclosed for the use in MIMO systems, without the use of the precoder per se. Instead, a general unitary precoder is grouped along with a PDA detector. The prior art PDA detector does not assume the existence of the precoder at the transmitter. The order in which the method selects to update the probabilities, i.e., which of the $p_n$ in a block should be updated first, is very important.

One ordering is in a decreasing order of an asymptotic equipartition energy (AEE). However, the structure imposed by the precoder allows for a better ordering. This ordering is now described.

Ordered-PDA Method

The order of the symbol probabilities is important to the performance of the method. Intuitively, in a fading channel, with or without precoding, it is expected that some of the symbols x, are less corrupted by the channel than others. Particularly, due to fading, the SNR is not the same for all the channel instances in a block, so that some of the $z_n$ pass through a channel with a high SNR, and others through a channel with a low SNR. Depending on which set of $z_n$ are "good," it is possible to select the $x_n$ that are less corrupted by the channel.

This is important to the PDA method because the value of the probability estimate produced by the PDA method depends on all previous estimates. Hence, making a bad estimate early in the method can have a detrimental effects. First, the other estimates can be incorrect as a result of a wrong estimate, an effect referred to as error propagation. Second, even if error propagation can be corrected, then it can take extra iterations to correct the erroneous estimates, increasing processing time. A bad estimate is more likely on a symbol that is negatively affected by the channel.

Therefore, there is a distinct advantage of having the PDA first update the symbols that are known with a high degree of confidence based on a metric that quantifies the confidence (probability).

An example precoder uses a normalized Hadamard matrix and a BPSK signal. The generalization is described later. When the precoder is the Hadamard matrix, each element is a 1 or −1, normalized by $\sqrt{N}$. When the matrix is multiplied by the BPSK sequence x, the resulting sequence z contains elements which take values in the set $$z = \left\{ -\frac{N}{\sqrt{N}}, -\frac{N-2}{\sqrt{N}}, \ldots, 0, \ldots, \frac{N-2}{\sqrt{N}}, \frac{N}{\sqrt{N}} \right\},$$

see FIG. 3 below.

Moreover, the system model y=Hz+w can be written as N independent equations. Furthermore, the statistics of the noise $w_n$ are known, as the noise has been assumed to be white complex Gaussian. Hence, the likelihood $p(y_n|z_n=z,h_n)$ is determined for each z by $$p(y_n \mid z_n = z, h_n) \propto \exp\left( -\frac{|y_n - h_n z|^2}{2\sigma_w^2} \right),$$

where $\sigma^2$ represents the noise variance.

A prior probability distribution is selected on each of the $z_n$, e.g., set all $z_n$ to be uniform on z. Although this selection is naïve, it works well in practice. A better selection is the actual marginal prior probability of each of the $z_n$. That is, the preferred ordering is based on the actual probability that the precoder produced the element $z_n$, and using knowledge of the received element after the effect of the channel. Essentially, any ordering based on a confidence metric on the received elements can be used to determine the sequence of elements to decode. Starting from the most confident and progressing to lesser and lesser confident elements of the received block.

In the case of the Hadamard matrix with BPSK signal sequence, each $z_n$ is binomially distributed with parameters (N, 0.5). Specifically, $$Pr\left( z_n = \frac{N-2k}{\sqrt{N}} \right) = \frac{1}{2^N} \binom{N}{k}, k = 0, 1, 2, \ldots, N.$$

Using the above selection of the prior probability distribution and likelihood, a posterior distribution is determined for each $z_n$ based on Bayes' theorem $$Pr(z_n = z \mid y_n, h_n) = \frac{Pr(y_n \mid z_n = z, h_n)Pr(z_n = z)}{\sum_{z \in Z} Pr(y_n \mid z_n = z, h_n)Pr(z_n = z)}.$$

The posterior distribution is mapped into a posterior mean, $$\mathbb{E}[z_n \mid h_n, y_n] = \sum_{z \in Z} z p(z_n = z \mid y_n, h_n).$$

The posterior mean is used as a prior mean with the unitary property of the normalized Hadamard matrix, where the posterior mean is treated like a prior mean for this mapping.

As the $x_n$ are BPSK, $$p_n = Pr(x_n = 1) = \frac{1 + \mathbb{E}|x_n|}{2},$$

where for the expected values of $x_n$ the expectations determined from $z_n$ are used.

Then, a sequence of probabilities for the $x_n$ can serve as the starting point for the PDA method, i.e., rather than initializing all $p_n$ to 0.5 as in the prior art step 203 of FIG. 2. This estimate, which takes the channel information into account, is a better starting point, especially in terms of the speed of convergence for the PDA method.

The $p_n$ form a metric that depends on the likelihood information, and can thus serve as the confidence metric. When $p_n$ is very close to 0.5, i.e., equiprobable, the likelihood information indicates that the estimate of $x_n$ is not confident, close to 1 means $x_n$ is probably 1, and close to 0 $x_n$ is −1, i.e., the distance from 0.5 is indicative of the confidence. Here, "close to" means within some small threshold distance. Therefore, the ordering in which PDA updates the probabilities is the decreasing order of distance of $p_n$ from 0.5, the $p_n$ that is furthest from 0.5 is be updated first. Equivalently, the order can be an ascending an order of the quantity $p_n(1-p_n)$, which gives rise to the same ordering. That is, for a particular interpretation of the vector $p_n$, when $p_n$ is close to 0.5, we are not confident. Therefore, we order the elements for processing according to $|p_n-0.5|$ or equivalently $p_n(1-p_n)$ Furthermore, the ranking possibly enables that the PDA update steps not be applied on a fraction of the symbols. The converged symbols do not require a PDA update, which decreases processing time. Therefore, the ordering mechanism accomplishes two goals.

The ordering provides a metric and a means to determine the metric, and thereby provides a method of ranking the transmitted symbols in such a way that PDA updates the best symbols first, reducing the probability of error propagation. The ordering also provides an initial set of probabilities, which already have some information regarding the symbols, which has the potential of reducing the run-time further, as it is possible that certain symbols may have already converged.

Now we consider other precoding matrices and other constellations. The advantage of the Hadamard precoder with BPSK signals is that the set z is discrete and finite. This is not the case with other precoders.

Even for the Hadamard precoder with a non-BPSK constellation, it is not clear immediately how quickly the size of the set z increases with constellation size. For example, the DFT precoder, with x being BPSK, has a z that can conceivably take more than $$3^{\frac{N}{2}}$$

different values. This increases for non-BPSK constellations. The PRPP matrix, regardless of the constellation, has an infinite-dimensional precoding space. Hence, it is inconceivable that the likelihoods be determined at each z.

Nevertheless, two important facts remain about the set z. Because the power in the block cannot be increased, and the original power in the block is N, the precoder cannot map any sequence into a point z where any dimension exceeds $\sqrt{N}$, i.e., every z remains contained within the circle of radius $\sqrt{N}$ in the complex plane, see FIG. 3.

The typical sequence of x contains an equal number of ones and minus ones, and from x to z is a linear map. Therefore, it is to be expected that the majority of the $z_n$ are clustered about the origin. FIG. 3 shows the complex plane where all the elements of the precoded block, z=Px, lie.

Figure 3:
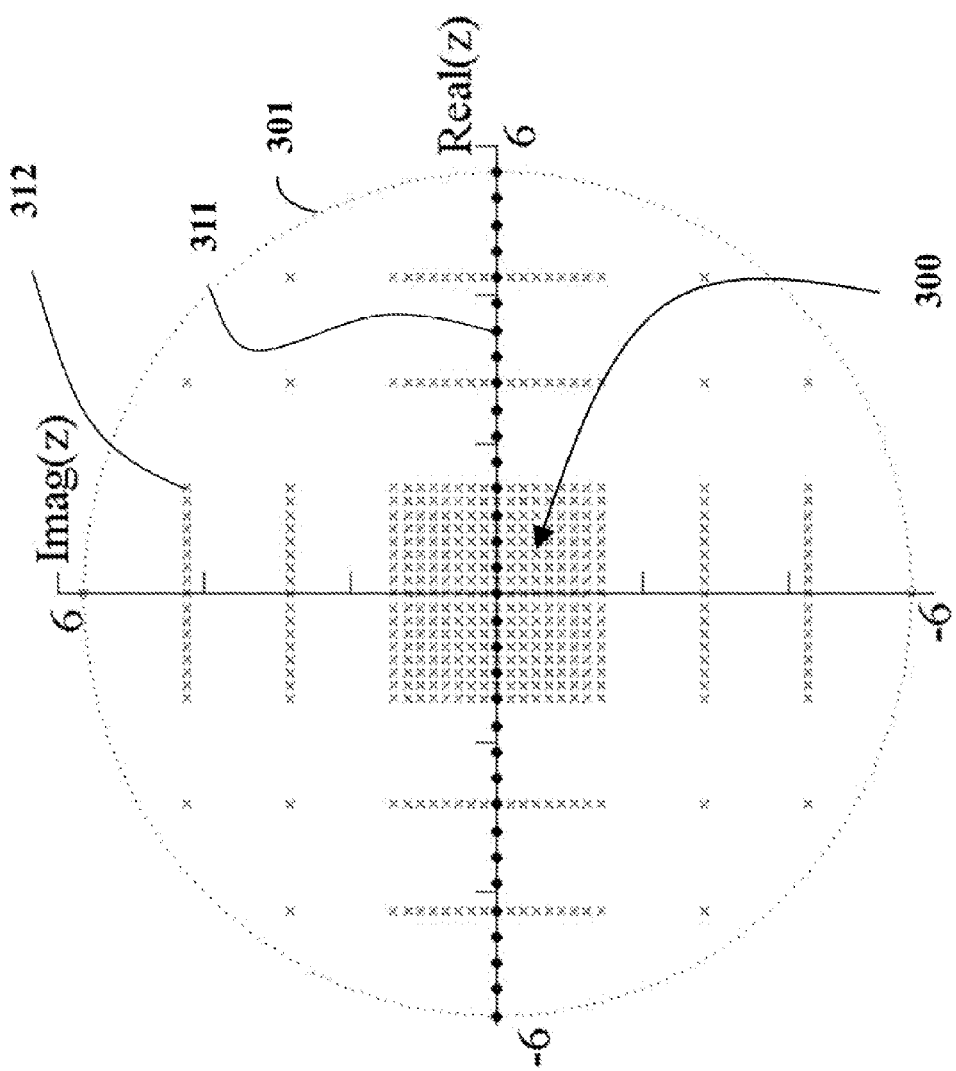
FIG. 3 is a schematic of an example selection of a set of points to determine likelihoods required for ordering according to the embodiments of the invention.

As shown in FIG. 3, the above two facts indicate that we can form a set z that is sufficiently accurate for ordering by selecting a subset of points of the circle 301 of radius $\sqrt{N}$, and ensuring preferably that most selected points 300 are close to the origin. The example of the set of points is for N=32. With the Hadamard precoding of BPSK sequences, there are N+1 possible points for each $z_n$ as shown by the dots 311 in FIG. 3.

For general matrices and constellations, the crosses 312 represent one set of points z that could be used to determine the likelihoods. Clearly, all the points in the set have a magnitude less than, or equal to $\sqrt{N}$, and that the density of the selected points close to the origin is high when compared to the points farther away. Any set satisfying these conditions is likely to perform comparably well.

One other modification, with respect to the prior art, is the selection of prior probability distribution for each $z_n$. Whereas for the BPSK signal with a Hadamard precoder the binomial distribution was used, it is not a reasonable selection for complex random variables. However, if $$z_n = \frac{1}{\sqrt{N}} \sum_{k=1}^{N} p_{nk} x_k,$$

where the $p_{nk}$ are the elements of the precoding matrix; and that the $x_n$ are i.i.d., for large enough N, then the validity of the central limit theorem can be assumed, which allows us to approximate the distribution of each of the $z_n$ by complex normal distributions of zero mean and unit variance.

After the set z and the prior are selected, the method can follow the same procedure as for the BPSK signal and Hadamard precoder.

Above, we assumed a Hadamard precoder, and a BPSK modulation. This extends the development of prior distributions for ordering to other precoders and modulations and uses a Gaussian approximation.

Figure 4:
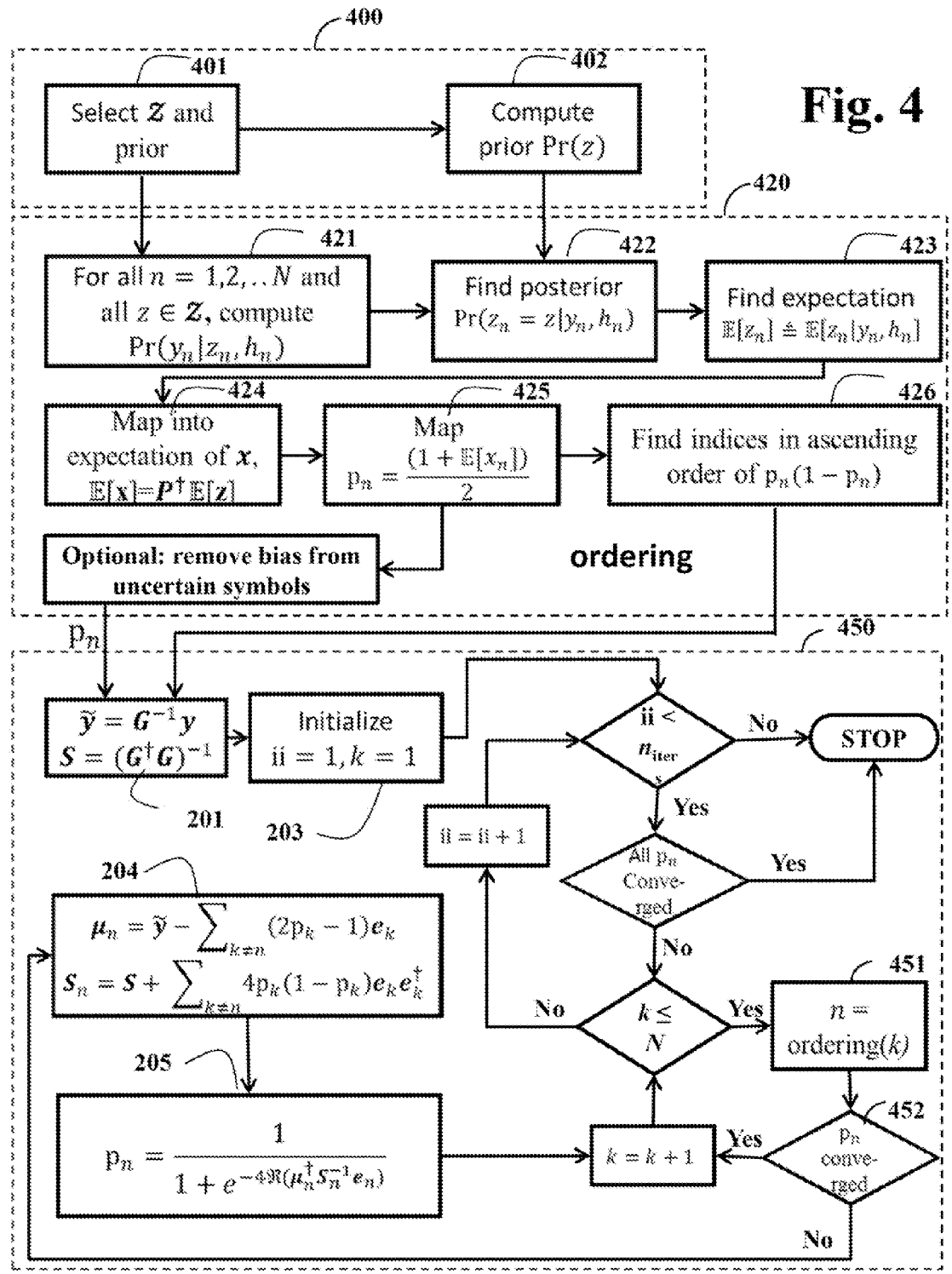
FIG. 4 is a flowchart of the Ordered PDA method according to the embodiments of the invention.

The complete method is shown in FIG. 4. The operations in box 400 are performed once and can be done offline. We select 401 z and the prior probability distributions, and compute 402 Pr(z) for every z. The ordering process 420 produces an ordering 426 and an initial distribution, via the steps of calculation of likelihood 421 for every z. We incorporate the prior 402 into the likelihood 421 to form the posterior 422, and using the posterior 422 and the set z to find the expectation 423 of each $z_n$ using the expectation of the $z_n$ to form the expectations of $x_n$ 424. We map 425 the expectations into the probabilities of $x_n$, given by $p_n$ to determine the ascending order 426, which can be done by any sort technique; for example, a bubble sort.

The set of indices is termed the ordering, so that ordering (k) gives the element with the $k^{th}$ smallest value of $p_n(1-p_n)$, which is the same as the $k^{th}$ symbol that is be processed by the PDA method.

An optional improvement 427 selects those symbols which have $p_n$ very close to 0.5, i.e., equiprobable, and remove the bias in the symbols by setting them to 0.5. This is to account for the fact that it is possible that symbols that are highly uncertain should not be biased by the likelihood procedure, which might be noisy.

The PDA method 450 starts with the set of probabilities $P_n$ and runs with the ordering 426. Note that this is extremely similar to the PDA method represented in FIG. 2, with the following exceptions.

During each iteration, in the $k^{th}$ update step, the ordering $k^{th}$ symbol is updated 451, rather than updating the $k^{th}$ symbol.

After determining the ordering $k^{th}$ symbol in 451, an additional step checks if that symbol needs to be updated 452. This saves some computation within each iteration, and ensures that only the required symbols are updated.

The K-PDA Method

While the ordering improves the performance, it may not always converge to the ML solution. The above described modifications can cause the ordered PDA method to converge more often to the ML solution by running the PDA method K times, hence giving rise to the K-PDA, which is now described. Again, the BPSK modulated case is considered, consideration of other modulation formats are straightforward generalizations.

PDA is subject to error propagation, as an error is made in a block of the PDA method increases the probability of the rest of the symbols being in error. The ordering mechanism 420 of FIG. 4 reduces the error propagation by ensuring that the first symbols decoded are accurate. Nevertheless, if an error is made anywhere in a block even with ordering, the error propagates. Certain precoders are more susceptible to this effect than others. In particular, the Hadamard precoder suffers from relatively severe error propagation, wherein the first error made leads to a number of errors being made in the block.

It is reasonable to expect that after ordering, the symbol most likely to be wrong after an iteration of the PDA method, and hence induce multiple errors in the following iterations of the method is the one that had the least confidence to begin with, i.e., the one that came last in the ordering.

The ordering mechanism 420 provides an initial probability $p_n$ for each n, which PDA updates. Multiple probabilities $p^0_n$ are involved, one for each iteration of the PDA method. The PDA method converges to a new set of probabilities $p^1_n$, because these are the probabilities after one run of the PDA method. These are mapped into hard decisions $\hat{x}_{PDA}^1$ on the symbols.

At this stage, the least likely symbol in the original ordering is considered. Suppose that this is the $I_1$ th symbol. Then, consider running PDA with the starting probabilities $p_1^0, \ldots, p_{l_1-1}^0, 1-p_{l_1}^1, p_{l_1+1}^0, \ldots, p_N^0 p_1^0, \ldots, p_{l_1-1}^0, 1-p_{l_1}^1, p_{l_1+1}^0, \ldots, p_N^0$. That is, the starting probabilities are the same as those of the first iteration, except that of the least confident symbol, whose probability is exactly inverted from what it converged to in the first run of the PDA method. Suppose the probabilities converge to $p_n^2$ and that the solution is $\hat{x}_{PDA}^2$.

Once again, consider the $2^{nd}$ least likely element originally, i.e., the penultimate index in the original ordering, and denote its index by $l_2$. Let the starting probabilities be $p_1^0, \ldots, p_{l_2-1}^0, 1-p_{l_2}^2, p_{l_2+1}^0, \ldots, p_N^0 p_1^0, \ldots, p_{l_1-1}^0, 1-p_{l_1}^1, p_{l_1+1}^0, \ldots, p_N^0$ and run PDA starting with these, i.e., the second least confident symbol probability is the inverse of what it converged to in the previous iteration. Then another solution, denoted probabilities $p_n^3$, is obtained. This process continues until the solution $\hat{x}_{PDA}^K$ is obtained.

The solutions $\hat{x}_{PDA}^1, \ldots, \hat{x}_{PDA}^K$ are compared based on the likelihood measure, and the best one, which maximizes the likelihood, is selected as the solution to the problem. Equivalently, the solution is selected as $$\hat{x} = \arg\min_{x \in [\hat{x}_{PDA}^1, \ldots, \hat{x}_{PDA}^K]} |y - Gx|^2.$$

Figure 5:
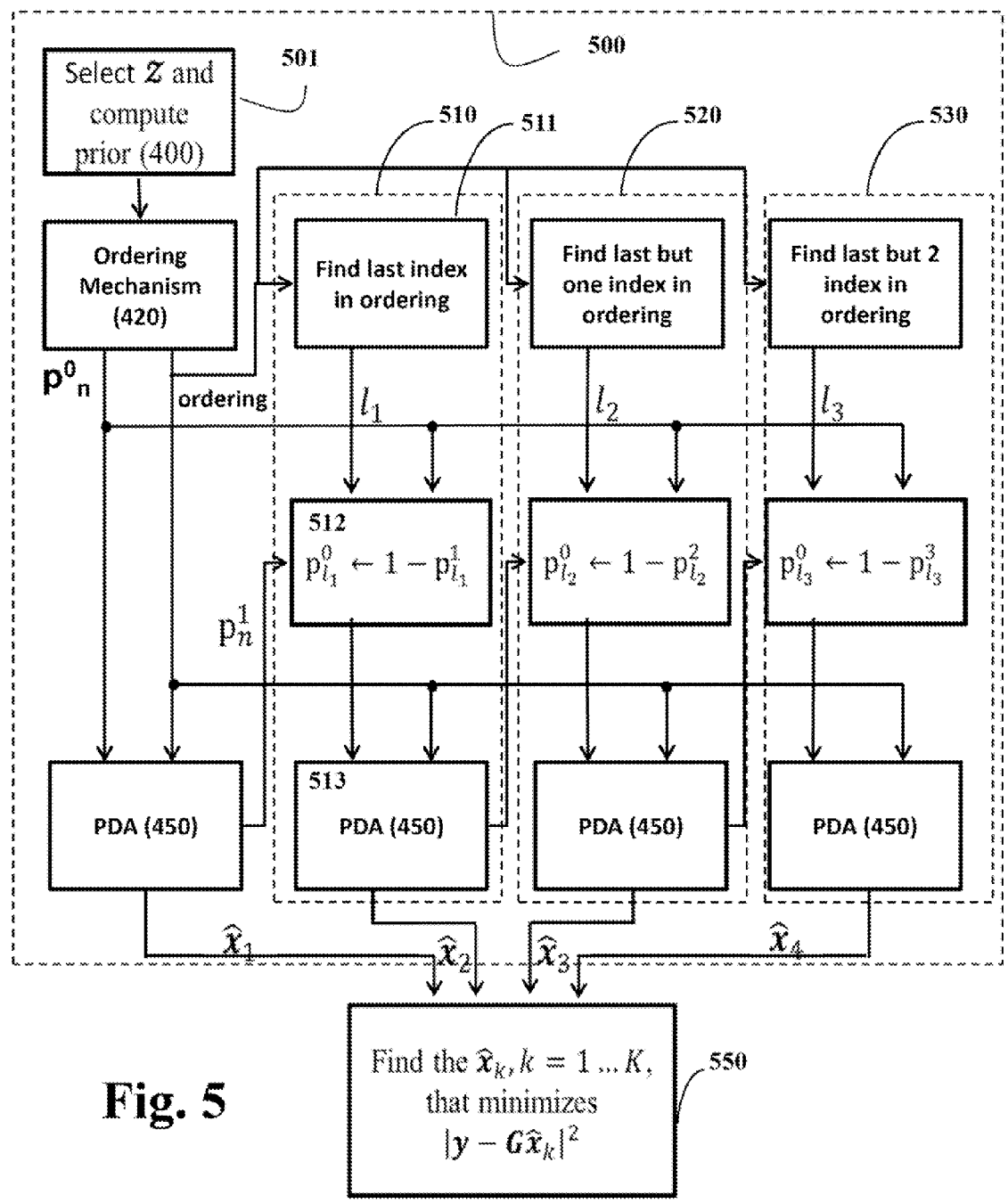
FIG. 5 is a flowchart of a K-PDA method according to the embodiments of the invention.

FIG. 5 shows the operation of the method as described above in the special case when K is 4, i.e., for 4-PDA. The operation of the first and second stages is as follows.

The selection 501 of the symbol set and computation of the prior probability distribution 400 and the ordering mechanism 420 are the same as described for FIG. 4. The ordering mechanism 420 provides and order and an initial set of probabilities $p_n^0$ to the PDA method 450.

The crux of this embodiment is that we just run the ordered PDA process K times, while modifying the starting probabilities of the least confident bit. Each time we do this, we expect the ordered PDA to converge to a different symbol vector. After K times, we have K vectors. Then, we select the vector that has the largest likelihood.

The PDA 450 also operates as described for FIG. 4 and produces a final set of probabilities $p_n^1$ and a final hard symbol decision sequence $\hat{x}_{PDA}^1$, which is passed to the likelihood calculator 550. The ordering is passed to the module 511 that selects the last index from the ordering.

This symbol, along with the probabilities $p_n^0$ and $p_n^1$ are passed to the inverter 512, which replaces the probability of the symbol index provided by 511. This value is passed along with the ordering to the PDA 513, which is again identical to the PDA 450, and produces a final set of probabilities $p_n^2$ and a final hard symbol decision sequence, which is passed to the likelihood calculator 550.

The modules 511, 512 and 513 form 1 stage 510 of the K-PDA. This stage 510 is repeated (520, 530) K−1 times, e.g., three times for 4-PDA. All the stages are identical excepting that in the $2^{nd}$ stage, the least confident symbol, i.e., the last in the ordering, is selected for inversion, in the $3^{rd}$ stage, the second least confident symbol, the last but one in the ordering, is selected, and so on. In general, in the $k^{th}$ stage, the $(k-1)^{th}$ least confident symbol is selected for inversion.

The likelihood calculator 550 determines the likelihood of the solution of each of the stages, or as in the FIG. 5, a sufficient statistic thereof. The final symbol sequence selected by the likelihood calculator is the one of the k solutions that has the highest likelihood, or in this case, the least value of the shown sufficient statistic. This is the solution of the K-PDA method.

It is to be noted that the likelihood calculator 550 is a decision device for the K-PDA method. The K-PDA concept is implemented by the block 500, and the likelihood computation can be replaced with other possible mechanisms for determining the final solution from the candidate solutions produced by 500. One such example is for the Hamming parity encoded signal for Hadamard precoders, as described herein.

After inversion of the likelihood, a reordering can be performed at each stage. The inversion can be on the probabilities for the converged symbol during the first stage, rather than during the immediately preceding stage as described.

A survivor strategy can be employed where the likelihood computation is performed after each stage and only the optimal solution is maintained for comparison a randomly selected symbol can be inverted, rather than the least confident ones.

The embodiment has the best performance, in large part because it appears to explore the most different solutions.

A Coding Scheme for the Hadamard Pre-Coded K-PDA-Hamming/Parity Encoding

The following observations can be made for the errors made by PDA and Ordered PDA methods with Hadamard precoded signals. The errors made in a block occur in groups of 1, 2, 4, 8, etc. With high probability, the errors are equally distributed over the sub-blocks of length $2^m$. For example, if 8 errors are made in a block of length 32, with high probability, the first 16 symbols have 4 errors, the first 8 have 2, and the first 4 have 1 symbol in error. However, the probability that the first 4 symbols have 1 error is lower than the probability that the first 8 have 2, which in turn is lower than the probability that the first 16 have 4. This is the justification for using a small block code to protect the first few symbols of the transmitted vector.

Thus, a coding scheme is designed that can detect 2 errors within the first block of 8 symbols, which in the case of BPSK modulation, as considered here, is the same as detecting 2 errors in a block of 8 bits, hence in the following the terms bits and symbols are used interchangeably. The outputs of the K-PDA stages of FIG. 5, rather than being passed to the Likelihood Calculator 550, are passed to the detector, which first checks to detect the errors, and then passes all the possibly different solutions that pass muster to the likelihood calculator. The basic idea is to encode the first set of 8 symbols to be transmitted with a code that can detect up to two errors. Then, we run the K-PDA algorithm to obtain K candidate decision vectors. We discard any candidate vectors for which the first 8 bits cannot be decoded. Then, a maximum likelihood decision is applied to the remaining vectors.

A code that can detect up to 2 errors in a block of 8 bits is the so-called (7, 4)-Hamming Code. The code adds 3 parity bits to 4 data bits. This code has the advantage of great simplicity of implementation. Thus, this code is applied to the first 4 data bits. The rest of the bits are transmitted uncoded. For a particular embodiment, we use a (7,4) Hamming code.

As an additional optional check, a further parity check bit can be added. This helps to detect 1 bit errors. It is particularly useful in systems wherein the receiver can request retransmissions after detecting errors. The hamming code results in 7 bits, however, we could use one more parity bit if so desired.

With the additional parity bit, a total of 4 redundant bits are added. This gives a code rate for a total block size of N BPSK symbols of $$\frac{N-4}{N}.$$

Without the additional parity bit, a code rate of $$\frac{N-3}{N}$$

is obtained. For the rest, the presence of the parity bit is assumed. However, the modifications for the case when it is not present are relatively simple.

Figure 6:
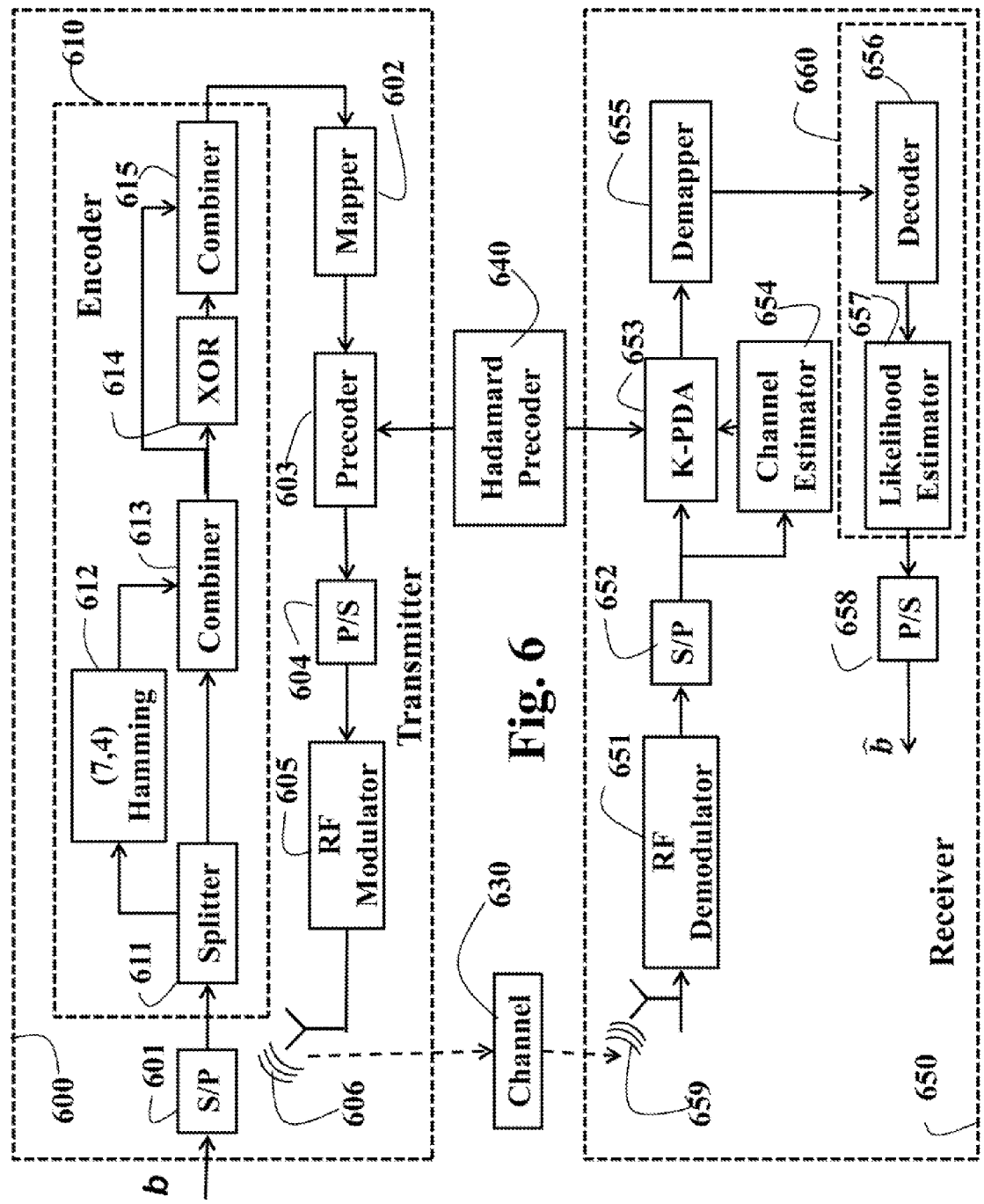
FIG. 6 is a block diagram of the transceiver using the K-PDA method according to the embodiments of the invention.

As shown in FIG. 6, the transmitter and receiver structures are modified to account for the addition of the code bits. At the transmitter 600, the bits b, which in this case has an information sequence length of N−4, are passed to the serial to parallel converter 601, which then passes a single block of size N−4 to the encoder 610.

The encoder includes the following components. The splitter 611 separates the first 4 bits of the information sequence from the rest of the information sequence A (7, 4)-Hamming code 612 that is applied on the first 4 bits of the information sequence.

A combiner 613 combines the Hamming-coded bits with the rest of the information bits from the splitter 611. An even parity generator implemented through, for instance, a multi-input XOR module 614, which generates an even parity bit p from the remaining n−1 bits. A combiner 615 appends the parity bit to the N−1 bits from 613.

The encoder output is passed to the mapper 602, which maps the bits into symbols. A precoder 603 maps the symbol sequence using the Hadamard precoder 640. A P/S converter 604 and RF circuitry 605 form a RF signal suitable for transmission by a set of one or more transmit antennas 606 over the channel 630.

At the receiver 650, the RF signal is received by a set of one or more receive antennas 659; demodulated to baseband by the RF circuitry 651; and parallelized by a S/P converter 652.

This resulting signal is passed to the K-PDA 653, which is identical to 500 of FIG. 5. The K-PDA requires a channel estimator 654, similar to the channel estimator 154 in FIG. 1.

The candidate solutions from the K-PDA method are passed to the decoder 656 via the demapper 655. The subset of the candidate solutions selected by the decoder is passed to the likelihood estimator 657. The blocks 656 and 657 (together 660) perform the action of just the likelihood estimator 550 of FIG. 5, i.e., they perform the action of decision making on the candidate solutions of the K-PDA. Finally, the solution selected by 660 is serialized by 658, a S/P converter.

Decoder

Figure 7:
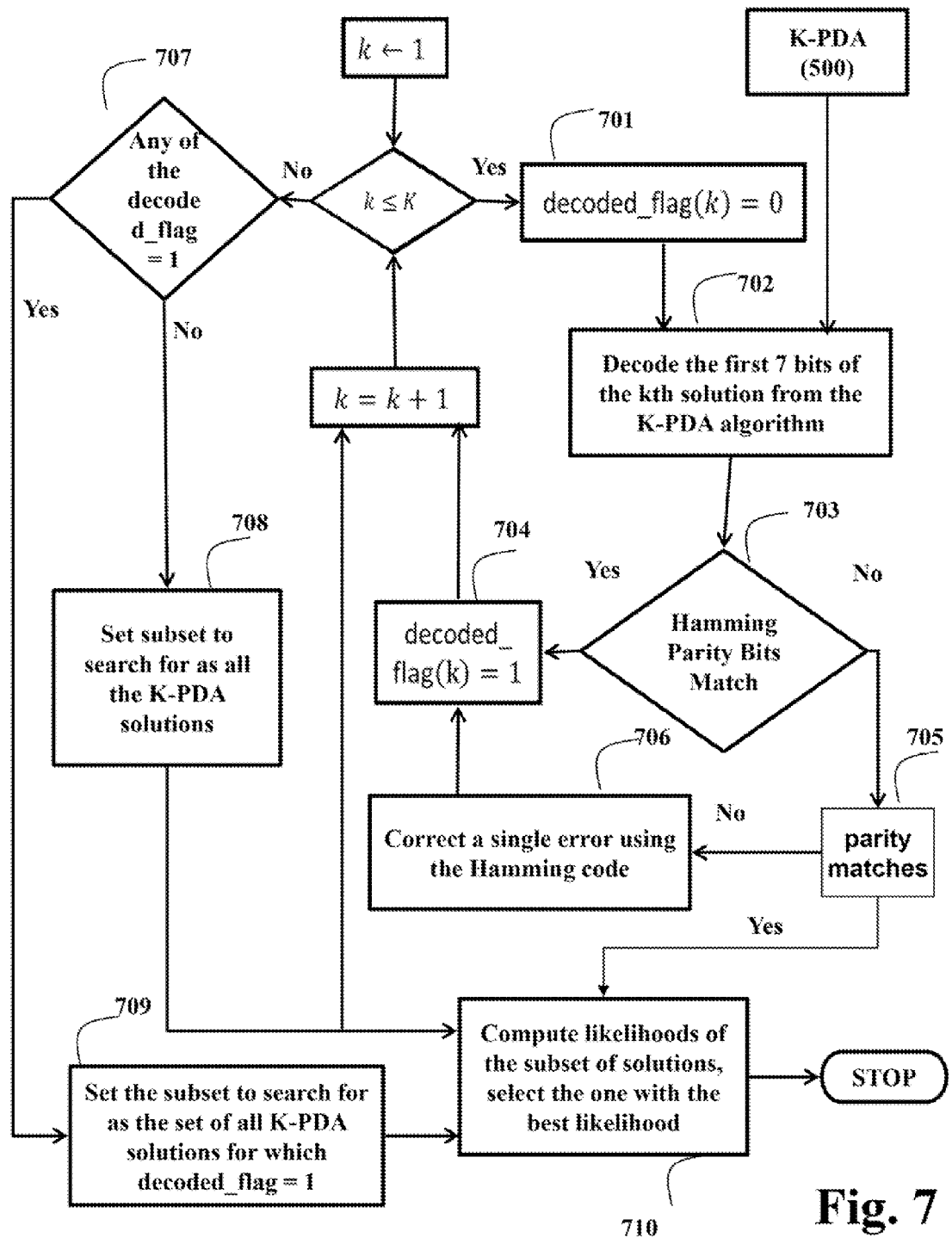
FIG. 7 is a flowchart of an operation of a decoder for a Hamming-Parity coded signal according to the embodiments of the invention.

FIG. 7 shows the operation of the decoder. The K different candidate solutions are passed to the decoder from the module 500. For each solution $\hat{x}_{PDA}{}^K$, the decoder performs the following. First, the decoding flag for k is set 701 to 0.

The first 7 bits are checked for errors using the Hamming parity check matrix 702, 703. If there are no errors in the first 7 bits, the decoded flag for that k is set 704 to 1 to indicate that the block has been decoded.

This does not mean that there are no errors in this block. Two more error events are still possible. A block error might have occurred, wherein however there were no errors in the first block of 8 symbols. However, this is unlikely. A single bit can be in error outside the block. While it is possible to detect this using the parity bit, correcting it is not possible with this embodiment of the invention. However, though this is not shown, it is possible to use this to flag a block error in systems where this is appropriate.

If the Hamming parity check indicates that the first 7 bits have at least 1 bit in error, then the parity bit is checked, 705. If the parity bit is correct, then there is a block of, most likely, 2, 4 or 8 errors. The decoding flag is left at 0 and the method proceeds to the next iteration. If the parity bit is wrong, then we assume that there is one error in the first 7 bits and correct it using the Hamming code 706. This makes the signal consistent with a codeword, but can be a wrong assumption.

After K iterations, the decoding flags are checked 707. If at least 1 solution is consistent, only the set of solutions which are consistent with codewords in this code 709 are selected 708 for the likelihood calculator 710, which is the same as 550. This compares the likelihood of solutions that it receives and picks the one with the largest likelihood. Thus, if at least 1 of the K-PDA solutions has been decoded to a consistent codeword, all the solutions of K-PDA that have been decoded to a consistent codewords are compared in terms of their likelihoods and the best one selected as the solution of the method. If none of the solutions are consistent, then all the solutions of the K-PDA method are compared for likelihoods and the best one is selected. This reduces to K-PDA as described herein.

Two modifications of the decoding procedure are possible. If the method exits the first time with a consistent solution, rather than running all the K solutions, there is clearly a speed advantage. There is the possibility that after the method detects an error, the decoder gives up, which can be appropriate in systems where retransmission is a possibility. It is reiterated that for the purpose of simplicity, this description is exemplary rather than a comprehensive.

In summary, the invention is a modification of the prior art PDA detector and decoding. A number of our modifications rise to better bit-error rate performance. In addition, we assume that the data symbols (x) are precoded before transmission. Then, the PDA detector makes use of the structure of the precoder to improve its performance. Note that the PDA detector decides on a whole vector or block of symbols at a time.

In first embodiment, we use a detection ordering of the received precoded symbol (Ordered-PDA). That is, we examine the receive block of N elements, and order the elements so that the PDA process first processes elements that have the highest confidence.

The second embodiment (K-PDA) builds on the first embodiment, and the observation that if an error occurs then the error is most likely to occur on the last element determined by the ordering, i.e., the least confident symbol in the received vector. In this scheme, we just run the ordered PDA process K times to obtain K candidate vectors, and select the vector that has the greastest likelihood.

The final modification only applies when we have a Hadamard precoder and BPSK modulation. In this embodiment, we add a small bit of redundancy via a block code to the original bit stream, e.g., for a N=32 bit transmit block, we transmit 28 bits and 4 additional parity check bits.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for decoding a signal in a radio frequency (RF) receiver with a set of one or more receive antennas, wherein the signal is precoded by means of a precoding matrix and then transmitted over a channel subject to fading, comprising;
   demodulating the signal to a baseband signal;
   serial to parallel converting the baseband signal to a precoded signal;
   estimating a channel matrix from the precoded signal;
   detecting symbols in the precoded signal using the channel matrix, wherein the decoding uses probabilistic data association, and the detecting further comprises:
   initializing a probability distribution for each symbol;
   selecting an ordering in which to update the probability distributions; and
   updating, according to the ordering, the probability distribution for is each symbol until a termination condition is reached; and
   demapping and parallel to serial converting the symbols to estimate a sequence of bits used to generate the signal.

2. The method of claim 1, wherein the termination condition is convergence of the probability distributions, or a predetermined number of iterations.

3. The method of claim 1, the ordering comprises:
   selecting a set of points in a complex plane;
   determining a likelihood of each symbol at each point;
   forming a posterior distribution over the set of points using the likelihoods;
   determining an expected value for each symbol using the posterior distributions;

applying an inverse of the precoding matrix to the expected values to determine the probability distribution of each symbol.

4. The method of claim 3, wherein the precoding matrix is unitary, and the inverse is a Hermitian operation.

5. The method of claim 3, wherein symbols that are close to equiprobable are set to be equiprobable.

6. The method of claim 1, wherein the ordering is descending.

7. The method of claim 1, wherein the detecting uses probabilistic data association (PDA) to obtain a solution, and the ordering is descending, and further comprising:
mapping the probability distribution using the PDA until the termination condition is reached.

8. The method of claim 7, wherein the detecting further comprises:
obtaining one or more candidate solution for K iterations of the PDA.

9. The method of claim 7, where the detecting uses unique initial probability distributions.

10. The method of claim 8, wherein the probability distribution for a $k^{th}$ iteration is obtained from a $k-1^{th}$ itertation by modifying the $k^{th}$ least confident symbol, while all other probability distributions remain the same.

11. The method of claim 10, wherein a maximum likelihood is used to determine an optimal candidate solution.

12. The method of claim 1, wherein the precoding matrix is a normalized Hadamard matrix.

13. The method of claim 12, wherein the precoding applies a (7,4)-Hamming code to any 4 bits of the sequence of bits.

14. The method of claim 13, wherein the sequence of bits includes a parity bit.

* * * * *